United States Patent
Park

(10) Patent No.: US 7,927,961 B2
(45) Date of Patent: Apr. 19, 2011

(54) SELECTIVE ETCHING METHOD AND METHOD FOR FORMING AN ISOLATION STRUCTURE OF A MEMORY DEVICE

(75) Inventor: Dae Jin Park, Icheon-Si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/705,101

(22) Filed: Feb. 12, 2010

(65) Prior Publication Data

US 2010/0167494 A1 Jul. 1, 2010

Related U.S. Application Data

(62) Division of application No. 11/770,689, filed on Jun. 28, 2007, now abandoned.

(30) Foreign Application Priority Data

Sep. 1, 2006 (KR) .................. 10-2006-0084390

(51) Int. Cl.
*H01L 21/76* (2006.01)
(52) U.S. Cl. ........ 438/404; 438/424; 438/700; 438/702; 438/703; 438/763; 257/E51.04
(58) Field of Classification Search .................. None
See application file for complete search history.

(56) References Cited

U.S. PATENT DOCUMENTS

| 6,808,746 B1 | 10/2004 | Dai et al. |
| 2004/0080260 A1 | 4/2004 | Park et al. |
| 2004/0265755 A1 | 12/2004 | Park et al. |
| 2005/0048414 A1 | 3/2005 | Harnack et al. |
| 2006/0163686 A1 * | 7/2006 | Liu et al. ................ 257/501 |
| 2008/0153991 A1 | 6/2008 | Park et al. |

FOREIGN PATENT DOCUMENTS

| CN | 1530404 A | 9/2004 |
| CN | 1585067 A | 2/2005 |
| CN | 1622252 A | 6/2005 |
| CN | 1778664 A | 5/2006 |
| JP | 10282649 | 10/1998 |
| JP | 11-274470 | 10/1999 |
| JP | 2001281864 | 10/2001 |
| JP | 2003-109974 | 4/2003 |
| JP | 2004-333805 | 11/2004 |
| JP | 2005-49334 A | 9/2006 |
| KR | 10-2005-0022363 A | 3/2005 |
| KR | 10-2006-0024726 | 3/2006 |

OTHER PUBLICATIONS

English translation of JP10282649, translated on Aug. 14, 2010.*

* cited by examiner

*Primary Examiner* — David E Graybill
(74) *Attorney, Agent, or Firm* — Marshall, Gerstein & Borun LLP

(57) ABSTRACT

A disclosed selective etching method comprises mixing a polymer with carbon nanotubes, applying the mixture to an etching target layer to form a carbon nanotube-polymer composite layer, forming a hard mask by patterning the carbon nanotube-polymer composite layer, such that a part of the etching target layer is selectively exposed, and selectively etching the etching target layer exposed through the hard mask. The polymer preferably includes a photoresist. Also disclosed is a method for forming an isolation structure of a memory device using the selective etching method.

4 Claims, 4 Drawing Sheets

SELECTIVE ETCHING METHOD AND METHOD FOR FORMING AN ISOLATION STRUCTURE OF A MEMORY DEVICE

CROSS-REFERENCE TO RELATED APPLICATIONS

This is a division of U.S. application Ser. No. 11/770,689 filed Jun. 28, 2007, which claims the priority benefit under 35 USC 119 of Korean patent application number 10-2006-0084390 filed Sep. 1, 2006, the entire respective disclosures of which are incorporated by reference.

BACKGROUND

The invention relates to a method for fabricating a semiconductor device. More specifically, the invention relates to selective etching using a hard mask and a method for forming an isolation structure of a memory device using selective etching.

With decreasing design rules and increasing levels of integration for semiconductor devices, there have been attempts to make patterns finer by reducing the loss of photoresists. For example, there have been used etching masks made of a material having superior etching resistance and a high hardness, e.g., silicon nitride ($Si_3N_4$) or silicon oxynitride (SiON), as compared to photoresist etching masks. That is to say, in etching processes, there have been employed hard masks made of materials having a higher etching resistance than that of photoresist mask materials.

With the demand for an increase in etching rates and for fine linewidths of photoresist patterns, there have been suggestions to introduce hard masks having a multilayer structure including different insulating layers. In particular, to simplify the etching process of devices with transistors having a complicated structure, such as NAND flash memory devices, multilayer hard masks are used to etch a trench for isolating the device in each cell.

FIGS. 1 to 3 are cross-sectional views schematically illustrating a selective etching process using conventional hard masks.

Referring to FIGS. 1 to 3, non-volatile devices, such as flash memory devices, include a transistor having a structure in which a control gate is laminated on a charge storage layer or a floating gate. A device isolation structure to isolate devices in each cell is formed in accordance with a first pattern of the charge storage layer. That is, a selective etching process to first pattern the charge storage layer, and a trench etching process on the semiconductor substrate exposed during the first patterning are sequentially performed, thereby simplifying the process. As such, in an attempt to selectively etch multilayer etching targets, a multilayer hard mask structure is introduced.

More specifically, as shown in FIG. 1, a tunnel dielectric layer 12 including an oxide layer is formed on a semiconductor substrate 11. A charge storage layer 13 (e.g., a conductive polysilicon layer) is formed on the tunnel dielectric layer 12. A hard mask 17 used for selectively etching the charge storage layer 13 is formed on the charge storage layer 13. A process for forming the hard mask 17 will be illustrated in more detail. First, a pad layer 14 is formed on the charge storage layer 13. The pad layer 14 acts as a polishing stop point while a device isolation layer is planarized by chemical mechanical polishing (CMP). The pad layer 14 preferably includes a silicon nitride layer.

The hard mask 17 is a multilayer structure formed on the pad layer 14. The hard mask 17 may have a multilayered structure in which a plurality of insulating layers such as a silicon oxide layer 15 and a silicon oxynitride layer 16, each having a thickness of about 800 Å, are sequentially laminated. Then, a photoresist pattern 18 used for selective etching is formed on the resulting structure to a thickness of about 1,700 Å.

As shown in FIG. 1, the photoresist pattern 18 is used as an etching mask upon for selective etching to pattern the multilayered hard mask 17 or to firstly pattern the charge storage layer 13. As shown in FIG. 2, the hard mask 17 is used as an etching mask upon selectively etching a region where the semiconductor substrate 11 is exposed through the first pattern of the charge storage layer 13.

As shown in FIG. 3, the multilayered hard mask 17 is used as an etching mask upon selective etching to form a trench 19 by etching the exposed semiconductor substrate 11. Accordingly, the hard mask 17 includes a multilayer of insulating layers with a sufficient thickness having different etching selectivities so that the hard mask 17 can resist the etching step for forming a trench 19. There is a risk that the underlying silicon oxide layer 15 is partially lost upon etching. Accordingly, taking into consideration the etching residue, the thickness of the underlying silicon oxide layer 15 must be sufficiently secured.

In order to desirably function as an etching mask upon etching to pattern the multilayered thick hard mask 17, the photoresist pattern 18 is formed to a sufficiently large thickness while taking into consideration damage caused by etching. In a case where the photoresist pattern 18 is formed to an excessive thickness, it becomes difficult to finely expose and develop the photoresist pattern 18. In addition, the linewidths of the trench 19 and the charge storage layer 13 cannot be adjusted to a desired level. As a result, a reduction in process margin occurs. Furthermore, each insulating layer constituting the multilayered hard mask 17 necessarily involves deposition and etching processes, thus complicating the overall process.

Accordingly, to simplify the overall process and improve the fine pattern of the photoresist, there is a need to develop a method capable of reducing the total thickness of the etching mask including the hard mask 17 and the photoresist pattern 18.

BRIEF SUMMARY OF THE INVENTION

In accordance with one aspect, the invention provides a selective etching method including: forming a mixture including a polymer and carbon nanotubes; applying the mixture to an etching target layer, thereby forming a carbon nanotube-polymer composite layer; forming a hard mask by patterning the carbon nanotube-polymer composite layer, thereby selectively exposing a part of the etching target layer; and selectively etching the etching target layer exposed through the hard mask.

In accordance with another aspect, the invention provides a method for isolating memory cells of a memory device using a selective etching method including: forming a tunneling dielectric layer on a semiconductor substrate; forming a charge storage layer on the tunneling dielectric layer; forming a pad layer on the charge storage layer; forming a composite layer of carbon nanotubes and a polymer as a hard mask on the pad layer; sequentially selectively etching the pad layer, the charge storage layer, the tunneling dielectric layer, and the semiconductor substrate, each exposed through the hard mask, to form a trench arranged in accordance with the pattern of the charge storage layer; forming an insulating layer inside the trench such that the insulating layer fills the trench;

and subjecting the insulating layer to planarization until the pad layer is exposed to the outside, to isolate the resulting structure in each memory cell.

The polymer preferably includes a photoresist.

The step of forming a hard mask preferably includes exposing and developing the carbon nanotube-polymer composite layer.

The polymer may alternatively include an organic antireflective coating (ARC).

The pad layer preferably includes a silicon nitride layer.

The method preferably further includes forming a silicon oxide layer having a thickness smaller than the thickness of the silicon nitride layer as a sub hard mask at the interface between the pad layer and the hard mask.

The charge storage layer preferably includes a conductive polysilicon layer to store electrons injected by tunneling into the tunneling dielectric layer to form a control gate of a flash memory device.

The invention is directed to selective etching capable of reducing the total thickness of an etching mask including a photoresist pattern and a hard mask, and a method for forming an isolation structure of a memory device using the selective etching.

DETAILED DESCRIPTION OF THE INVENTION

Figure 1:
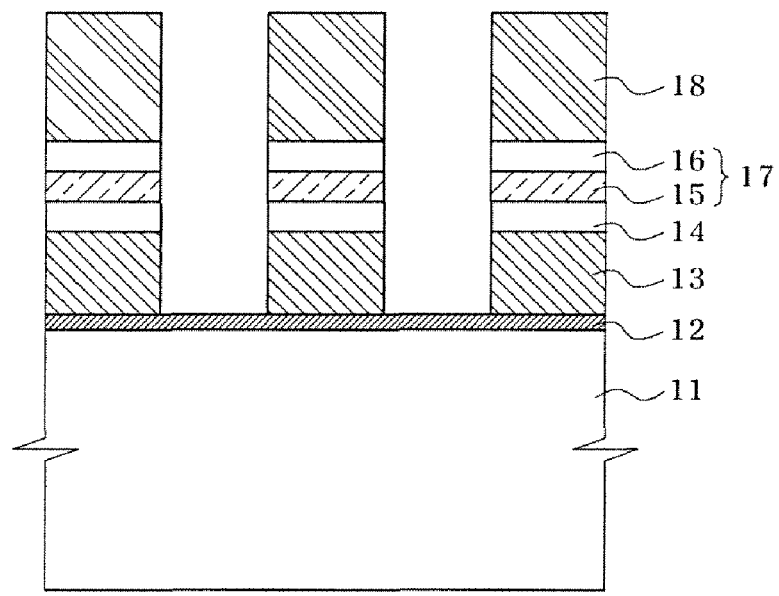
FIGS. 1 to 3 are cross-sectional views schematically illustrating a selective etching process using conventional hard masks.

The invention is explained in greater detail with reference to the following examples and the accompanying drawings. However, these examples are given for the purpose of illustration and are not intended to limit the invention. These examples are intended to illustrate the invention to a person of ordinary skill in the art.

In one embodiment, the invention is directed to a carbon nanotube-polymer composite layer used as a hard mask. The carbon nanotube-polymer composite layer is formed by mixing carbon nanotubes with an organic polymer, and applying the mixture to a semiconductor substrate. Carbon nanotubes have a microscopic structure in which each carbon atom is bonded to three adjacent carbon atoms to form hexagonal rings. Sheets of the hexagonal rings arranged in a honeycomb configuration are rolled to form cylindrical tubes. Such a cylindrical tube has a diameter of several nanometers (nm) to several tens of nanometers (nm) and a length to diameter ratio in the range of about ten to several thousand.

Carbon nanotubes have inherent electrical properties. In particular, carbon nanotubes are reported to exhibit excellent chemical resistance at room temperature as well as superior resistance against thermal, mechanical, and electrical stress. Based on these advantages, carbon nanotubes have superior resistance against etching plasma, electron beams, and the like, when compared to general polymeric materials, e.g., photoresists and organic antireflective coatings (ARC). Carbon nanotubes show superior thermal properties, high hardness, and excellent etching resistance, as compared to amorphous carbons.

These superior properties of carbon nanotubes are mainly based on the covalent bond between adjacent carbon atoms. Furthermore, carbon nanotubes exhibit significantly excellent electrical conductivity. Thus, they are more effective than silicon (Si) for emitting heat. Because of this advantage, carbon nanotubes prevent the deterioration of a polymer (e.g., photoresist) that is exposed to light.

Carbon nanotubes useful in the invention include single-walled carbon nanotubes, multi-walled carbon nanotubes, and nanotube ropes.

In one embodiment of the invention, carbon nanotubes are used for a hard mask by mixing the carbon nanotubes with a photoresist, and applying the mixture to a semiconductor substrate. The photoresist is preferably a photoresist for a KrF or ArF light source, or a resist material employed in a photolithographic process for fabricating a semiconductor. Organic resins (e.g., organic ARC materials for antireflective coating layers) or electron beam resist materials may be used as a replacement for the polymer.

When the photoresist is used as the polymer with which carbon nanotubes are mixed, a carbon nanotube-photoresist composite layer is patterned during a photographic process, including exposing and developing processes, thus advantageously eliminating the necessity of an additional patterning process. When an organic ARC material is used instead of the photoresist, a carbon nanotube-ARC composite layer is patterned during a patterning process of the organic ARC material, thus advantageously eliminating necessity of an additional patterning process.

A hard mask including the carbon nanotube-photoresist composite layer has high hardness and high strength, as compared to conventional hard masks. For this reason, the hard mask can efficiently function as an etching mask, although it is applied to a smaller thickness. As a result, the hard mask of the invention can avoid a reduction in the process margin which is a disadvantage of conventional hard masks having a larger thickness. Carbon nanotubes are not directly bonded to the underlying films, but are bonded through a polymeric layer to the underlying films. Accordingly, by removal of the polymeric layer, carbon nanotubes can be readily removed from the underlying films.

As the polymeric layer is removed by organic solvents (e.g., thinner) carbon nanotubes can be also removed together with the polymeric layer. Similarly, as the polymeric layer (e.g., photoresist layer) is removed by ashing, carbon nanotubes can be also readily detached from the underlying films. As a result, a hard mask made of the carbon nanotube-photoresist composite layer can be easily removed from the underlying films.

FIGS. 4 to 7 are cross-sectional views schematically illustrating selective etching using a hard mask according to one embodiment of the invention. For example, a process for forming a device isolation structure of a NAND flash memory device to which the selective etching is applied will be illustrated in more detail.

Figure 4:
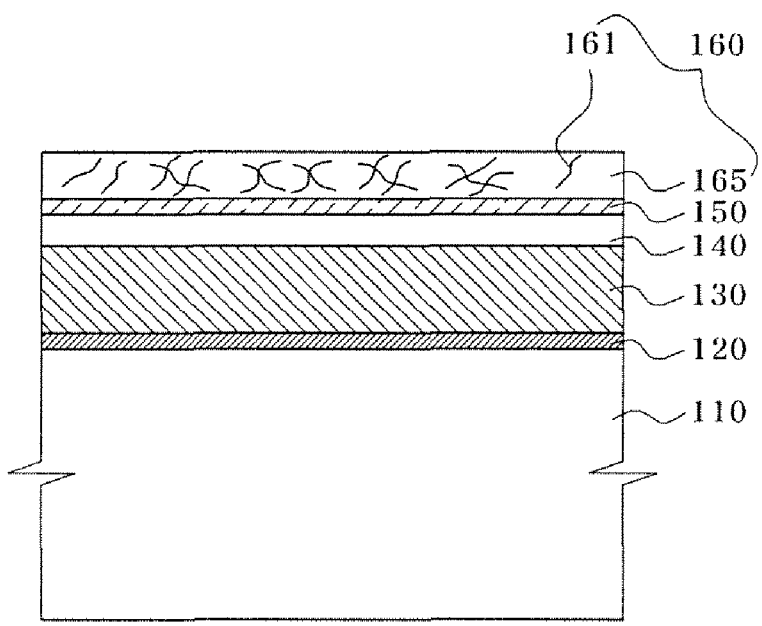
FIGS. 4 to 7 are cross-sectional views schematically illustrating selective etching using a hard mask according to one embodiment of the invention, and a method for forming an isolation structure of a memory device using selective etching.

Referring to FIG. 4, a tunnel dielectric layer 120 is formed on a semiconductor substrate 110 to permit electron tunneling in a flash memory device. The tunnel dielectric layer 120 may preferably include a silicon oxide layer. Then, a charge storage layer 130 is formed on the tunnel dielectric layer 120. The charge storage layer 130 preferably includes a conductive polysilicon layer.

A pad layer 140 acting to determine a polishing stop point is formed on the charge storage layer 130. The pad layer 140 preferably includes a silicon nitride layer. A silicon oxide layer 150 functioning as a buffer or sub hard mask is formed on the pad layer 140. The silicon oxide layer 150 may have a smaller thickness than that shown in FIG. 1 or 2. In contrast to conventional cases, the invention avoids the loss of the silicon oxide layer 150. Accordingly, the silicon oxide layer 150 can be formed to a smaller thickness as compared to conventional cases, because there is no expected loss to take into consideration.

A composite layer 160 of carbon nanotubes 161 and a polymeric matrix 165 are formed on the silicon oxide layer 150. The carbon nanotubes 161 may be in powder form. The polymeric matrix 165 is made of a liquid organic material, such as a photoresist or an organic ARC.

The carbon nanotubes 161 are mixed with the polymeric matrix 165. To simplify the patterning of a hard mask, the polymeric matrix 165 preferably includes a photoresist so that the composite layer 160 can be patterned using a photolithographic process including exposing and developing processes. The type of the photoresist (or resist) may be varied depending upon the light source (e.g., ArF, KrF or E-beam) applied in the exposure. Regardless of the photoresist type, the improvement in etching plasma resistance of the composite layer 160 is caused mainly by the carbon nanotubes 161.

As the relative amount of the carbon nanotubes 161 increases, resistance against chemical, thermal, electrical, and abrasion stress of the composite layer 160 improves. Additionally, the light emission efficiency and electron beam resistance are elevated. Taking into consideration the process costs and exposure conditions, the relative amount of the photoresist can be selected depending upon the process performed.

Figure 2:
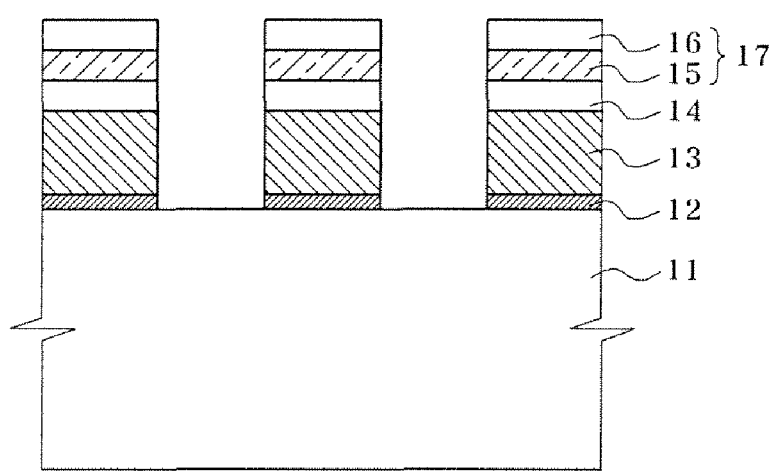
Figure 3:
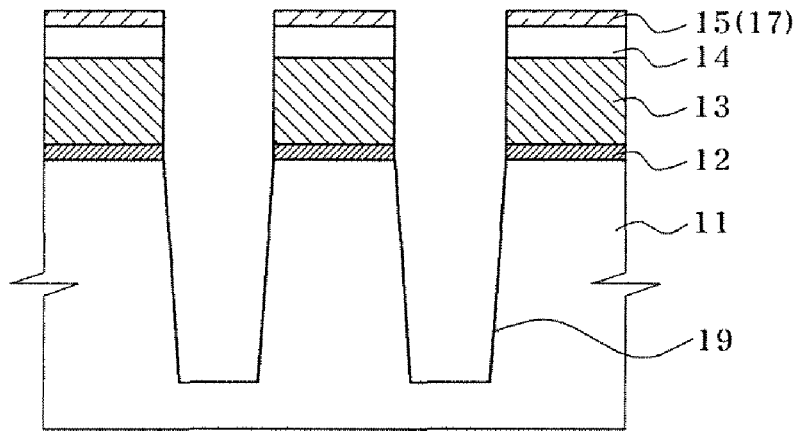

The polymeric matrix 165 for a photoresist is mixed with carbon nanotubes 161 and the mixture is applied to a semiconductor substrate 110 (on the silicon oxide layer 150 as shown in FIG. 1 to form the carbon nanotube-photoresist composite layer 160. Although not shown, in the case that the polymeric matrix 165 is made of an organic resin, such as an ARC, an additional photoresist pattern (not shown) necessarily involves selectively etching or patterning the composite layer of the carbon nanotubes and the organic resin by using a hard mask. Accordingly, in a case where a photoresist is used as the polymeric matrix 165, the composite layer 160 can be patterned by directly using exposing and developing processes. As a result, a simplified process can be realized.

Figure 5:
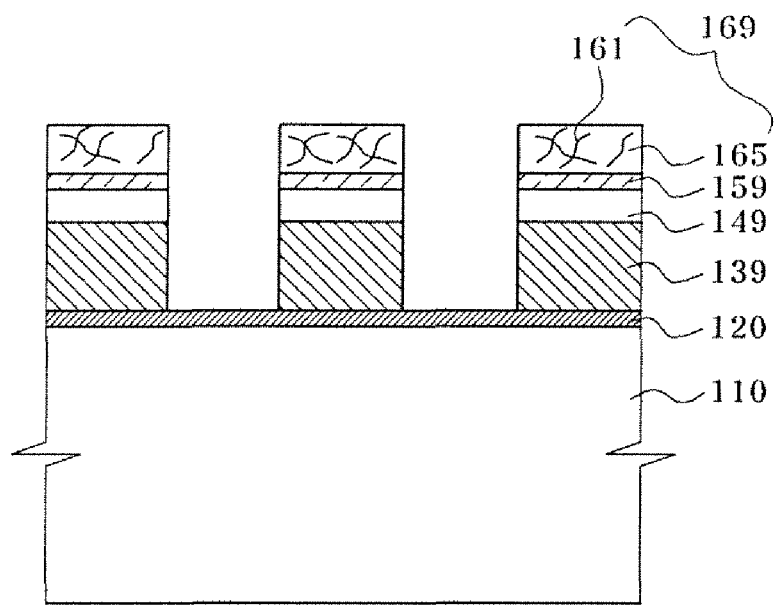

Referring to FIG. 5, the carbon nanotube-photoresist composite layer 160 is patterned to form a hard mask 169. The use of the polymeric matrix 165 enables the hard mask 169 to be patterned by employing a photolithographic process including exposing and developing processes.

After patterning the hard mask 169, the exposed underlying films (i.e., layers targeted for etching) are sequentially etched using the hard mask 169 as an etching mask. As a result, a sub hard mask including a silicon oxide layer pattern 159 and a pad pattern 149 are sequentially formed. By sequential selective etching, a charge storage pattern 139 is formed. This selective etching is carried out until the underlying tunnel dielectric layer 120 is exposed to the outside.

Figure 6:
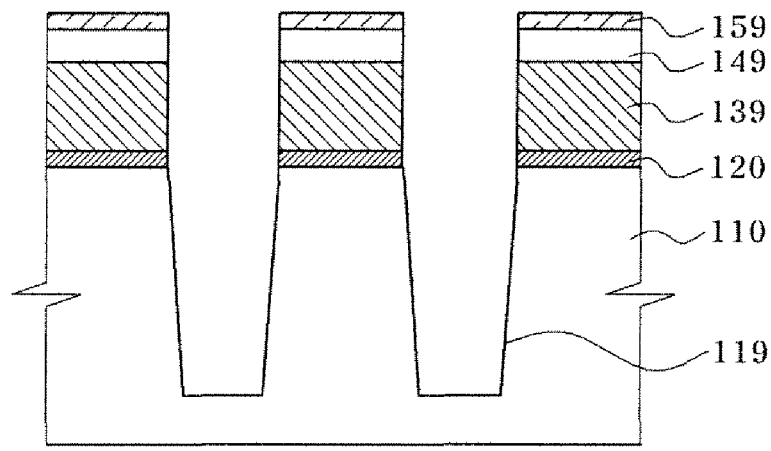

Referring to FIG. 6 together with FIG. 5, the exposed part of the tunnel dielectric layer 120 is selectively etched using the hard mask 169. Then, the exposed part of the semiconductor substrate 110 is etched to form a trench 119 inside the semiconductor substrate 110. The trench 119 is formed by selective etching involved in the patterning of the charge storage pattern 139, thus being self-aligned in accordance with the charge storage pattern 139. The trench 119 is used to form a device isolation structure such as a shallow trench isolation (STI) structure. The device isolation structure is where a transistor stack including the charge storage pattern 139 is arranged in each memory cell.

The hard mask 160 used as an etching mask in the selective etching or patterning processes has superior resistance against etching plasma as well as abrasion, thus eliminating the necessity of conventional silicon oxynitride (SiON) hard masks. That is to say, there can be omitted some layers from multilayer hard masks. For example, a SiON hard mask can be omitted. The reason for this omission is that carbon nanotubes included in the hard mask 160 serve as a barrier against electrons or plasma upon etching with electron beam or plasma, and thus the polymeric photoresist matrix 165 containing the carbon nanotubes 161 can be employed as the hard mask 160. As a result, the hard mask 169 permits a higher etching ratio according to the content of the carbon nanotubes 161.

Meanwhile, by addition of the carbon nanotubes 161, the loss amount of the photoresist polymeric matrix 165 caused by etching can be reduced. When compared to conventional photoresist patterns, there can be achieved a reduction in the thickness of the composite layer 160 containing the photoresist polymeric matrix 165 which is required to etch the underlying layers targeted for etching, e.g., the silicon oxide layer 150, the pad layer 140, the and charge storage layer 130 (see FIG. 4).

Therefore, since the composite layer 160 containing the photoresist polymeric matrix 165 can be intricately exposed and developed, the critical dimension (CD) of the hard mask 169 (can also be intricately controlled. As a result, the resulting hard mask 169 has a finer critical dimension (CD) as compared to conventional techniques. Thus, the charge storage layer pattern 139 and the trench 119 also have a correspondingly finer and more elaborate critical dimension (CD).

In addition, the loss amount of the hard mask 169 is significantly reduced, and thus the loss amount of the underlying silicon oxide layer 140 can be also efficiently inhibited. Accordingly, the silicon oxide layer 140 can have a smaller thickness. As a result, the height (or thickness) of a stack including all of the layers can be decreased, and the composite layer 160 can be also formed to a smaller thickness.

The carbon nanotubes 161 are fixed by the polymeric matrix 165 in the hard mask 169, thus being removed together with the polymeric matrix 165. That is, since the carbon nanotubes 161 are not directly bonded to the underlying films, they can be readily removed along with the polymeric matrix 165. Accordingly, when the polymeric matrix 165 is made of a photoresist, the hard mask can be easily removed by a process for removing the photoresist, e.g., ashing, or wet stripping using a solvent such as thinner.

Figure 7:
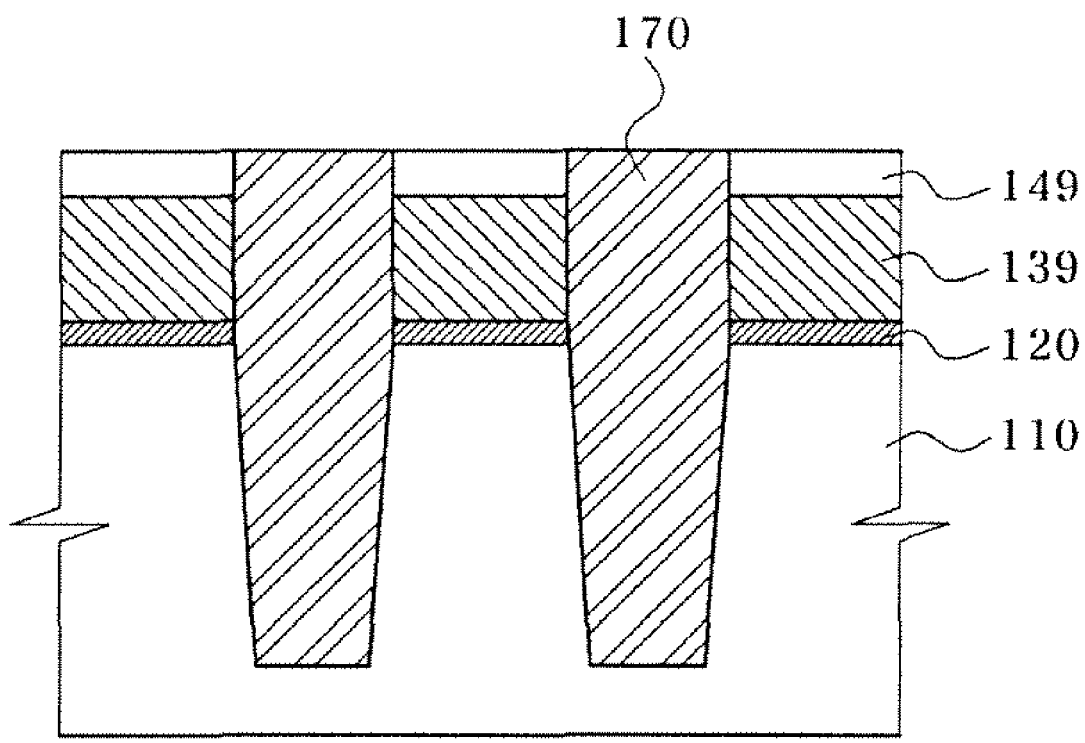

Referring to FIG. 7, after removal of the hard mask 169, an insulating layer 170 is deposited inside the trench 119 such that the insulating layer 170 fills the trench 119. The resulting structure is subjected to chemical mechanical polishing (CMP) planarization using the pad layer pattern 149 as a polishing stop point and isolated in each memory cell. As a result, a device isolation structure is formed. Then, the pad layer pattern 149 is selectively removed. Furthermore, a flash memory device can be fabricated by forming an interlayer dielectric film (not shown) and a control gate on the resulting structure.

As mentioned above, the etching technique using a carbon nanotube-containing hard mask according to the invention is applied to form a trench isolation structure of a flash memory device. Furthermore, the selective etching method using the hard mask of the invention can be also utilized in a simpler etching process, e.g., selective etching of layers targeted for etching. In addition, by mixing carbon nanotubes with organic ARCs rather than photoresists, the hard mask can be modified to prevent scattered reflection upon exposure to light and to serve as a hard mask. In this case, the carbon nanotube-containing organic ARC layer can be patterned through a hard mask by a selective etching process using the photoresist pattern as an etching mask, or patterning process.

As is apparent from the foregoing, according to the invention, the introduction of carbon nanotubes into a hard mask permits an increase in etching selectivity. As a result, the total thickness of the multilayered hard mask structure can be reduced due to an omission or decrease in the thickness of some hard mask layers.

Accordingly, a photoresist pattern to etch the hard mask can have a smaller thickness. In addition, since the hard mask is made of a composite of a photoresist and carbon nanotubes, it can be directly patterned using exposing and developing processes without introduction of an additional photoresist pattern. In addition, the hard mask can be removed by a process for removing the photoresist pattern. Accordingly, a simplified process can be used.

Furthermore, since the carbon nanotube-containing hard mask of the invention permits the total hard mask structure and the carbon nanotubes-containing hard mask to have a smaller thickness, a significant increase in process margin (in particular, exposure margin), and thus a finer pattern can be obtained. Therefore, when a very thick hard mask structure is necessarily introduced, such as a trench formation process for isolating flash memory devices, the process margin can be efficiently increased.

Although preferred embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. A selective etching method comprising:
   forming a mixture comprising an organic antireflective coating (ARC) and carbon nanotubes;
   applying the mixture on an etching target layer, thereby forming a carbon nanotube-organic antireflective coating (ARC) composite layer;
   forming a photoresist pattern by exposing and developing a photoresist layer on the carbon nanotube-organic antireflective coating (ARC) composite layer to expose the carbon nanotube-organic antireflective coating (ARC) composite layer;
   forming a hard mask by etching the carbon nanotube-organic antireflective coating (ARC) composite layer exposed by the photoresist, thereby selectively exposing a part of the etching target layer; and
   selectively etching the etching target layer exposed through the hard mask.

2. A method for forming an isolation structure of a memory device having memory cells using a selective etching method comprising:
   forming a tunneling dielectric layer on a semiconductor substrate;
   forming a charge storage layer on the tunneling dielectric layer;
   forming a pad layer on the charge storage layer;
   forming a mixture comprising an organic antireflective coating (ARC) and carbon nanotubes;
   coating the mixture on the pad layer, thereby forming a carbon nanotube-organic antireflective coating (ARC) composite layer;
   forming a photoresist pattern by exposing and developing a photoresist layer on the carbon nanotube-organic antireflective coating (ARC) composite layer to expose the carbon nanotube-organic antireflective coating (ARC) composite layer;
   forming a hard mask by etching the carbon nanotube-organic antireflective coating (ARC) composite layer exposed by the photoresist pattern;
   sequentially selectively etching the pad layer, the charge storage layer, the tunneling dielectric layer, and the semiconductor substrate, each exposed through the hard mask, to form a trench arranged in accordance with the resulting pattern of the charge storage layer;
   forming an insulating layer inside the trench to fill the trench with the insulating layer; and
   planarizing the insulating layer until the pad layer is exposed thereby isolating each memory cell.

3. The method according to claim 2, wherein the pad layer comprises a silicon nitride layer, and the method further comprises forming a silicon oxide layer having a thickness smaller than the thickness of the silicon nitride layer as a sub hard mask at the interface between the pad layer and the hard mask.

4. The method according to claim 2, wherein the charge storage layer comprises a conductive polysilicon layer capable of storing electrons injected by tunneling into the tunneling dielectric layer to form a control gate of a flash memory device.

* * * * *